United States Patent [19]
Paschal et al.

[11] Patent Number: 5,789,989
[45] Date of Patent: Aug. 4, 1998

[54] DELAY INTERPOLATING VOLTAGE-CONTROLLED OSCILLATOR WITH LINEAR TRANSFER FUNCTION

[75] Inventors: Matthew James Paschal, Rochester; David Warren Siljenberg, Byron, both of Minn.

[73] Assignee: International Business Machines Corporation, Armonk, N.Y.

[21] Appl. No.: 787,666

[22] Filed: Jan. 23, 1997

[51] Int. Cl.[6] ............................. H03B 27/00; H03B 1/00
[52] U.S. Cl. ............................. 331/57; 331/177 R
[58] Field of Search ........................... 331/57, 177 R

[56] References Cited

U.S. PATENT DOCUMENTS

| | | | |
|---|---|---|---|
| 4,230,953 | 10/1980 | Wilcox | 330/252 |
| 4,492,934 | 1/1985 | Sugimoto | 331/117 R |
| 4,884,041 | 11/1989 | Walker | 331/57 |
| 5,155,452 | 10/1992 | Ueda et al. | 331/177 R |
| 5,172,076 | 12/1992 | Brown | 331/57 |
| 5,300,898 | 4/1994 | Chen et al. | 331/57 |
| 5,422,603 | 6/1995 | Soyuer | 331/1 A |
| 5,465,075 | 11/1995 | Yaklin | 331/8 |
| 5,469,120 | 11/1995 | Nguyen et al. | 331/177 R |

OTHER PUBLICATIONS

Enåm et al., "NMOS IC's For Clock and Data Regeneration in Gigabit–Per–Second Optical–Fiber Receivers", IEE Journal of Solid–State Circuits, vol. 27., No. 12., Dec. 1992, (pp. 1763–1774).

Enam et al., "A 300–MHz CMOS Voltage–Controlled Ring Oscillator", IEE Journal of Solid–State Circuits, vol. 25, No. 1, Feb. 1990, (pp.312–315).

Syed et al., "Gigahertz Voltage–Controlled Ring Oscillator", Electronics Letters, vol. 22, No. 12, Jun. 5, 1986 (pp. 677–679).

*Primary Examiner*—David C. Nelms
*Assistant Examiner*—Trong Phan
*Attorney, Agent, or Firm*—Joan Pennington

[57] ABSTRACT

A delay interpolating voltage controlled oscillator (VCO) is provided. The delay interpolating VCO includes an input for receiving differential control input. A non-linear current steering circuit is coupled to the input for generating a non-linear delay responsive to the differential control input. A frequency signal is provided at a VCO output responsive to the differential control input and the non-linear delay with the frequency signal being linearly related to the differential control input.

9 Claims, 8 Drawing Sheets

DELAY INTERPOLATING VOLTAGE-CONTROLLED OSCILLATOR WITH LINEAR TRANSFER FUNCTION

CONTRACTUAL ORIGIN OF THE INVENTION

This invention was made with government support under Cooperative Agreement F33615-94-2-1582 awarded by the U.S. Department of Air Force. The government has certain rights in the invention.

FIELD OF THE INVENTION

The present invention relates to voltage controlled oscillators (VCOs), and more particularly to an improved delay interpolating voltage controlled oscillator (VCO).

DESCRIPTION OF THE PRIOR ART

Delay interpolating voltage controlled oscillators (VCOs) operate by changing the ring delay to change the VCO frequency. Delay interpolating ring VCOs have several advantages over other types of VCOs. Two advantages are that they are well suited to be implemented in logic processes, and they reject power supply changes when differential. A conventional single stage delay interpolating VCO is shown in FIG. 1. It consists of a differential delay cell labeled BUF and an analog multiplexer labeled ANALOG MUX. The differential outputs C0, C1 at P10 and P11 of the multiplexer are inverted before being applied back to the buffer inputs PA0, PA1, and the analog mux inputs PB0, PB1. This provides the odd number of inversions necessary for operation of all ring VCOs. The multiplexer performs an analog addition of its two input signal pairs PA0 and PA1, and PB0 and PB1. A conventional differential delay cell is shown in FIG. 2, and a conventional multiplexer is shown in FIG. 3. The differential analog control voltage V0, V1 in FIG. 1 and applied to pins PC0 and PC1 in FIG. 3 steers current from one side of the multiplexer to the other. In other words, V0, V1 controls the amount of current in the N-channel field effect transistors (NFETS) N4 and N5. If more current is in P-channel field effect transistor (PFET) P3 than in PFET P4 of FIG. 3, the VCO frequency of FIG. 1 will be low. Conversely, if more current is in PFET P4 than in PFET P3 of FIG. 3, the VCO frequency of FIG. 1 will be high. The delay around the ring in FIG. 1, therefore, is variable and depends on the differential control voltage V0, V1. The maximum delay is the delay of the delay cell BUF plus the delay of the multiplexer ANALOG MUX, and the minimum delay is just the delay of the multiplexer. Correspondingly, the maximum frequency of the VCO in FIG. 1 is 1/(min delay) and, the minimum frequency is 1/(max delay). The delay versus control voltage is linear when PFETs P3 and P4 in FIG. 3 are a matched transistor pair having equal width to length ratios. Since frequency equals 1/delay, the frequency of the VCO in FIG. 1 will be non-linear. FIG. 4 shows a plot of frequency versus control voltage for a typical delay interpolating VCO. When the delay versus control voltage is linear, the frequency versus control voltage is non-linear. This results in more range above the center frequency than below the center frequency.

A need exists for an improved delay interpolating voltage controlled oscillator (VCO) having frequency versus control voltage that is linear or in other words, having a linear transfer function.

SUMMARY OF THE INVENTION

A principal object of the present invention is to provide an improved delay interpolating voltage controlled oscillator (VCO).

In brief, a delay interpolating voltage controlled oscillator (VCO) is provided. The delay interpolating VCO includes an input for receiving a differential control voltage. A non-linear current steering circuit is coupled to the input for generating a non-linear delay responsive to the differential control input. A frequency signal is provided at a VCO output responsive to the differential control voltage input and the non-linear delay with the frequency signal being linearly related to the differential control input.

BRIEF DESCRIPTION OF THE DRAWING

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 5:
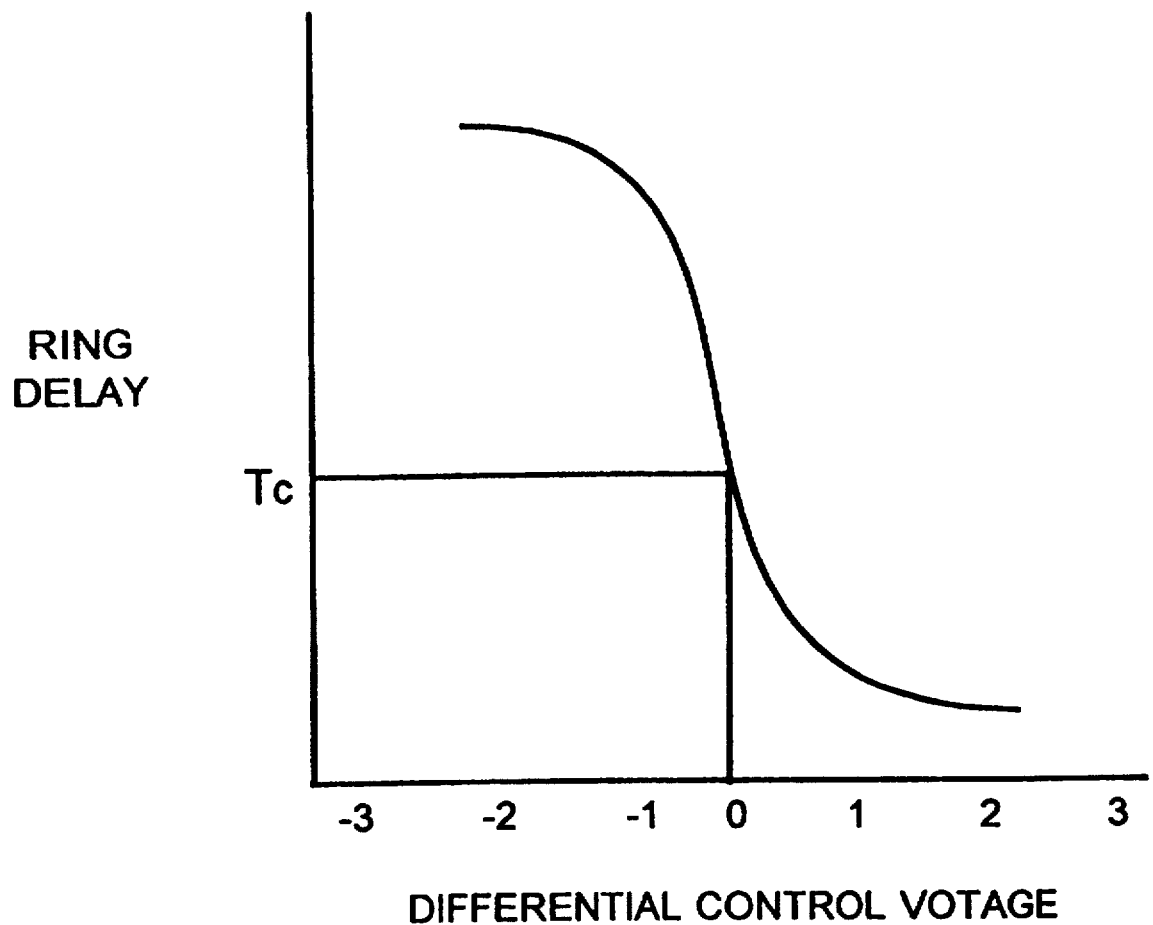
FIG. 5 is a chart illustrating a non-linear delay curve in accordance with the present invention.

Having reference now to the drawings, in FIG. 5 there is shown a non-linear delay curve of a delay interpolating voltage controlled oscillator (VCO) in accordance with the present invention. To obtain a linear transfer function or linear frequency versus control voltage characteristic, the delay of the VCO ring must be non-linear, as shown in FIG. 5. FIG. 5 shows delay relative to the vertical axis and control voltage relative to the horizontal axis. The illustrated delay versus control voltage is required to achieve a linear frequency versus control voltage characteristic.

Figure 1:
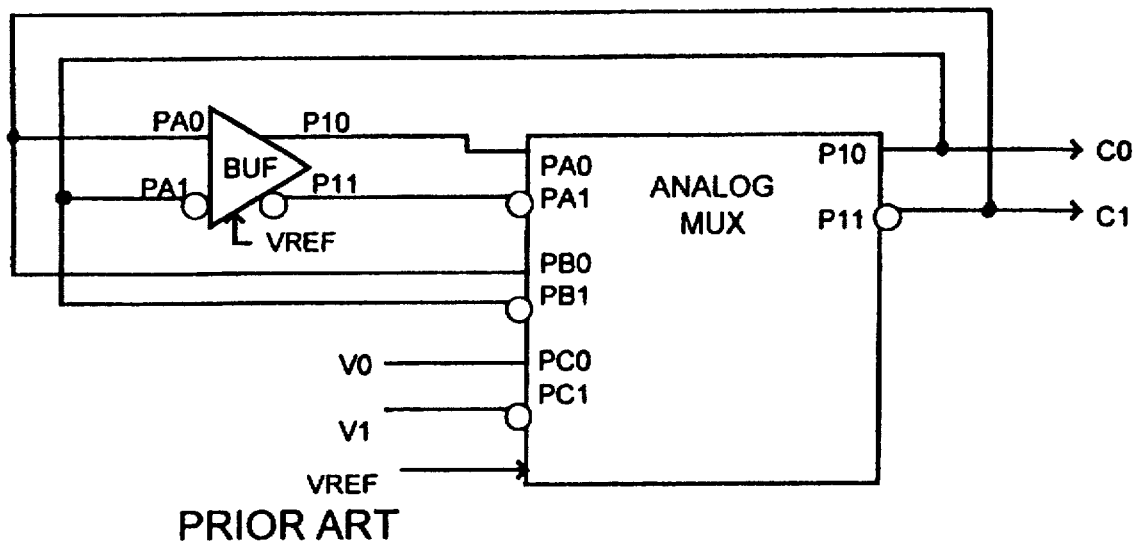
FIG. 1 is a block diagram representation of a prior art single stage delay interpolating voltage controlled oscillator (VCO)
Figure 6:
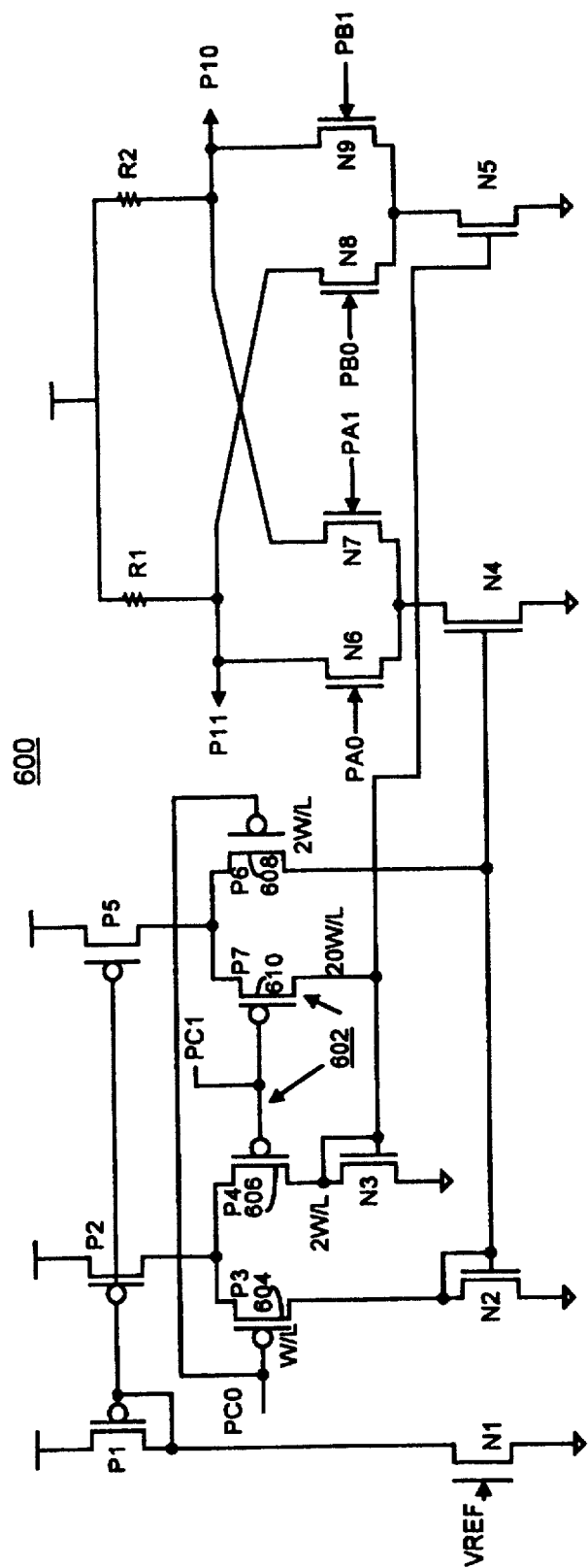
FIG. 6 is a schematic representation of a non-linear ring delay generating analog multiplexer of a delay interpolating voltage controlled oscillator (VCO) of the present invention.

FIG. 6 illustrates an analog multiplexer in accordance with the invention generally designated by the reference character 600 used, for example, with the single stage delay interpolating voltage controlled oscillator (VCO) of FIG. 1. Differential control voltage input is applied at inputs PC0, PC1. The analog multiplexer 600 obtains the non-linear ring delay characteristic illustrated in FIG. 5. The analog multiplexer 600 replaces the matched differential linear current steering transistor pair P3 and P4 of FIG. 3 with an analog differential non-linear current steering input circuit generally designated by the reference character 602 in accordance with the invention.

The analog differential non-linear current steering input circuit 602 includes two PFET transistor differential pairs P3 and P4, P6 and P7, 604 and 606, 608 and 610. The differential control input PC0, PC1 are applied to respective gates P3, P6, 604, 608 and P4, P7, 606, 610. The two transistor differential pairs P3 and P4, P6 and P7, 604 and 606, 608 and 610 have unequal gate width to length ratios such that the ring delay versus control voltage characteristic of FIG. 5 is obtained. As indicated in FIG. 6, the gate width to length ratios of PFETs P3 and P4 is W/L:2W/L and the gate width to length ratios of PFETs P6 and P7 is 2W/L:20W/L. The gain of the P3 and P4 transistor pair must be low and unbalanced, for example, as shown in FIG. 6 to achieve the characteristic from +1.0 V to 0.0 V in FIG. 5. The gain of the P6 and P7 pair must be high and unbalanced, for example, as shown in FIG. 6 to achieve the characteristic from 0.0 V to −1.0 V in FIG. 5. These four transistors P3 and P4, P6 and P7, 604 and 606, 608 and 610 produce the ring delay versus control voltage characteristic shown in FIG. 5. The width to length ratios shown in FIG. 6 are used to illustrate the need for unbalanced differential pairs. The specific W/L values and gain factors of the P3/P4 and P6/P7 pairs must be determined for each VCO implementation.

Figure 3:
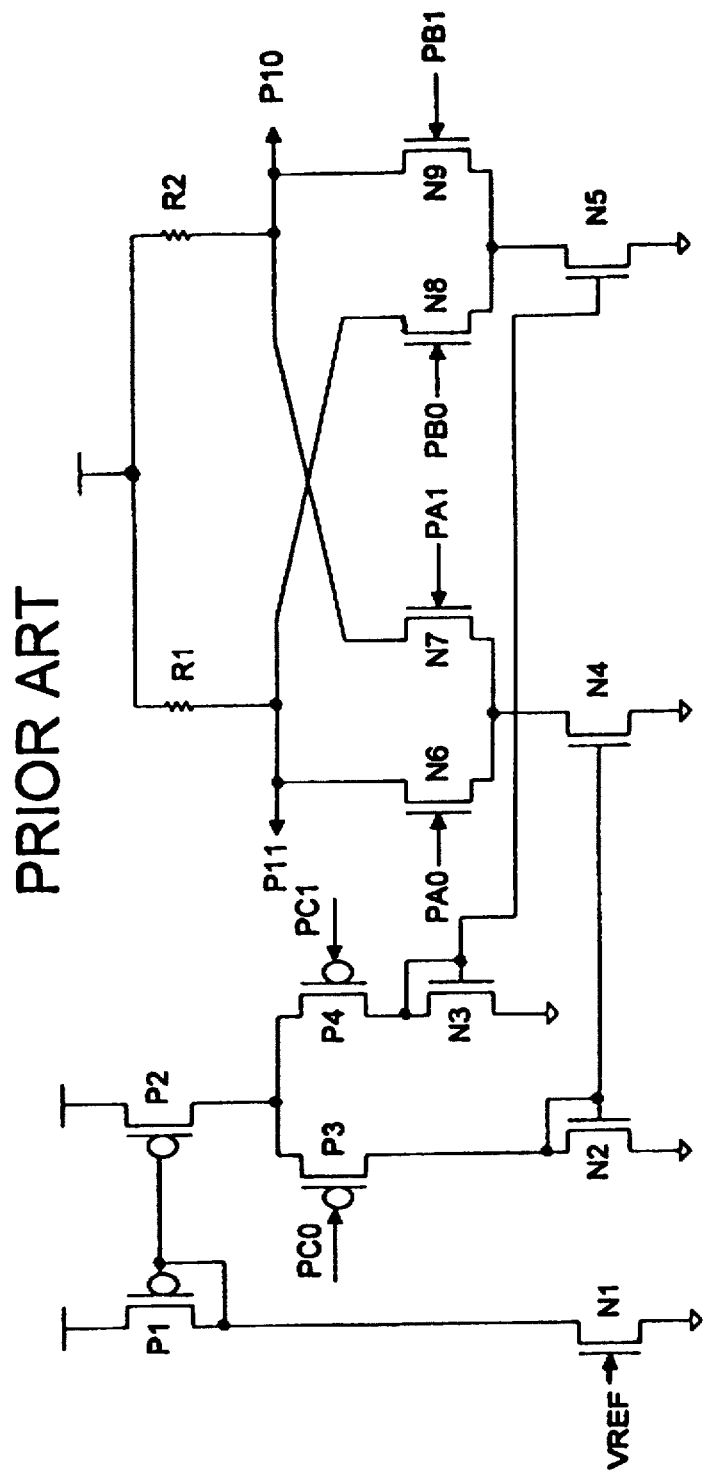
FIG. 3 is a schematic representation of a prior art analog multiplexer of the single stage delay interpolating voltage controlled oscillator (VCO) of FIG. 1.
Figure 4:
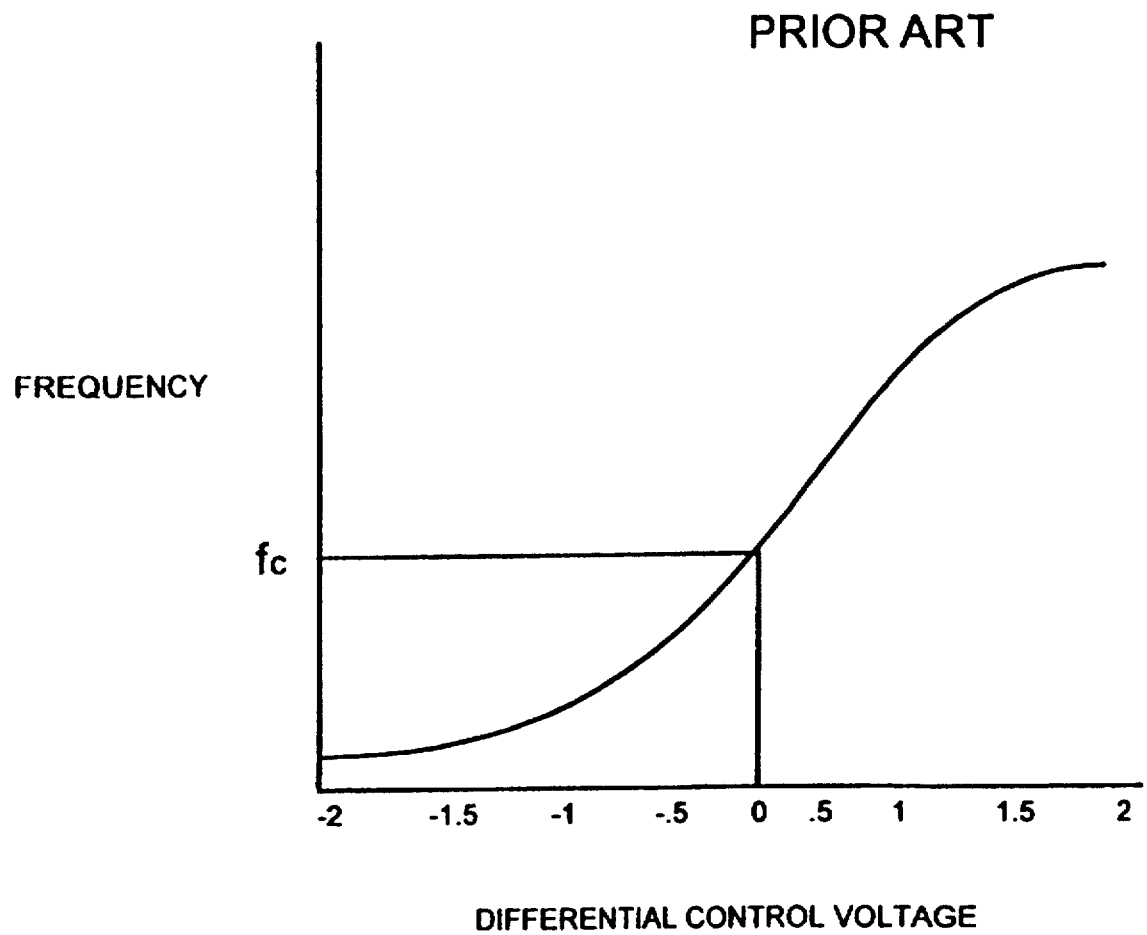
FIG. 4 is a chart illustrating a typical non-linear transfer curve of the delay interpolating voltage controlled oscillator (VCO) of FIG. 1.

As in the conventional analog multiplexer of FIG. 3, a reference voltage VREF is applied to the gate of NFET N1 with NFET N1 and P-channel FET P1 connected in series between a supply voltage. PFET P2 is connected in series between the supply voltage and the differential pair PFETs P3 and P4. PFET P5 is connected in series between the supply voltage and the differential pair PFETs P6 and P7. The two transistor differential pairs P3 and P4, P6 and P7, 604 and 606, 608 and 610 provide current steering to respective NFETs N4 and N5. The output frequency signal provided at P10, P11 of the cross-coupled differential NFET pairs N6, N7 and N8, N9 is linearly proportional to the differential control input responsive to the non-linear delay input circuit 602.

A non-linear current steering input circuit also advantageously can be used on a multiple stage delay interpolating VCO. A multiple stage delay interpolating VCO consists of more than one copy of the single stage of FIG. 1 connected in a ring with an odd number of inversions in the ring to make it oscillate. The non-linear current steering input circuit is included with all multiplexers 600 in the ring.

Figure 7:
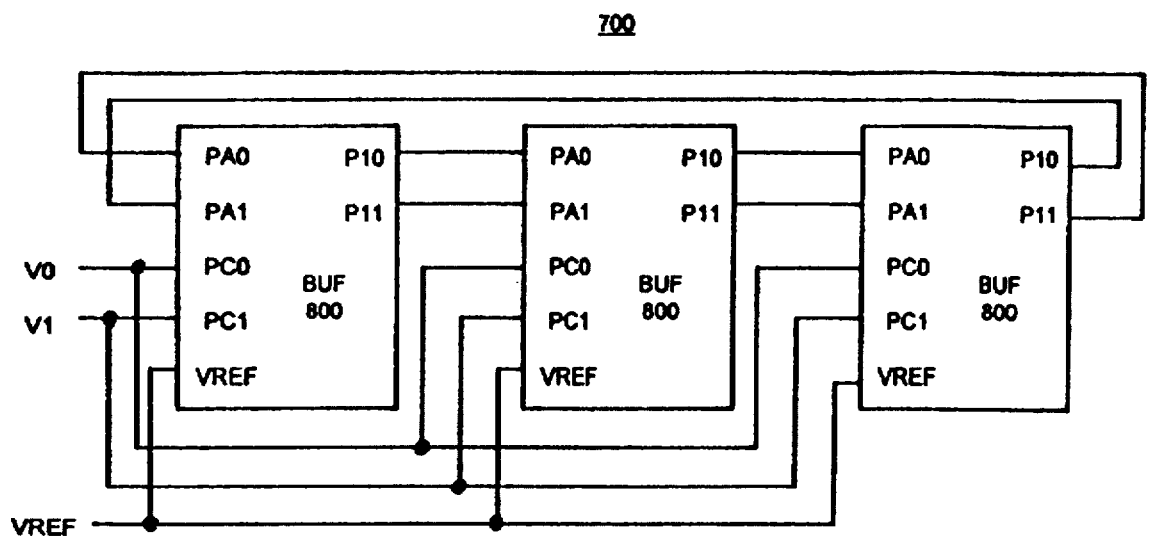
FIG. 7 is a block diagram representation of a differential inverter ring voltage controlled oscillator (VCO) including a non-linear delay curve of the present invention.
Figure 8:
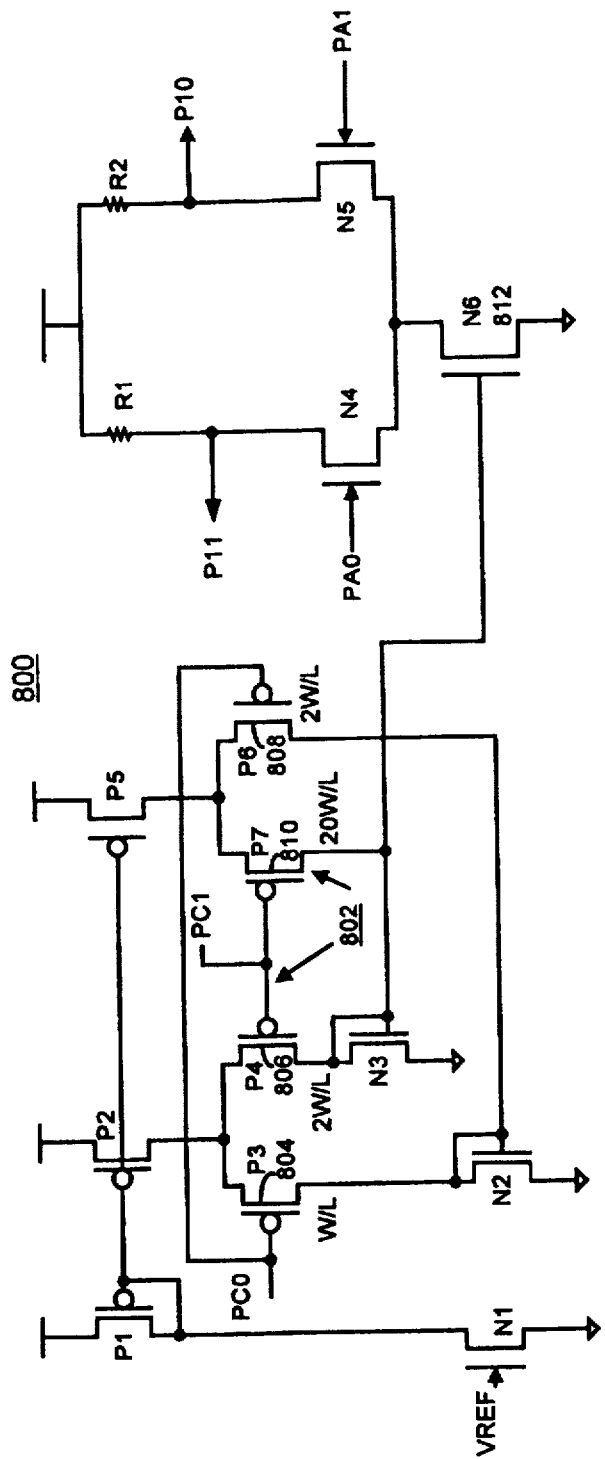
FIG. 8 is a schematic representation of the differential inverter buffers of the differential inverter ring voltage controlled oscillator (VCO) of FIG. 7 of the present invention.

A non-linear current steering input circuit also advantageously can be used on any delay based ring VCO, such as a differential inverter ring VCO as illustrated in FIG. 7. The differential inverter ring VCO 700 is constructed of three differential inverter buffers 800. The differential inverter buffers 800 are illustrated in FIG. 8. The differential inverter buffers 800 are similar to the delay cell of FIG. 2 with a non-linear current steering input circuit 802. The frequency of the differential inverter ring VCO 700 is controlled by making the current in N6 of FIG. 8 a function of the control voltage inputs PC0 and PC1. By providing a non-linear ring delay versus control voltage like that of FIG. 5, the frequency versus control voltage of the differential inverter buffers 800 is linear. The non-linear current steering input circuit 802 includes two PFET transistor differential pairs P3 and P4, P6 and P7, 804 and 806, 808 and 810. The differential control input PC0, PC1 are applied to respective gates P3, P6, and P4, P7. As in the non-linear ring delay generating mux described above, the two transistor differential pairs P3 and P4, P6 and P7, 804 and 806, 808 and 810 have unequal gate width to length ratios such that the delay versus control voltage characteristic of FIG. 5 is obtained for the ring VCO of FIG. 7. As indicated in FIG. 8, the gate width to length ratios of PFETs P3 and P4 is W/L:2W/L and the gate width to length ratios of PFETs P6 and P7 is 2W/L:20W/L. The gain of the P3 and P4 transistor pair is low and unbalanced to achieve the characteristic from +1.0 V to 0.0 V in FIG. 5. The gain of the P6 and P7 pair is high and unbalanced to achieve the characteristic from 0.0 V to −1.0 V in FIG. 5.

Figure 2:
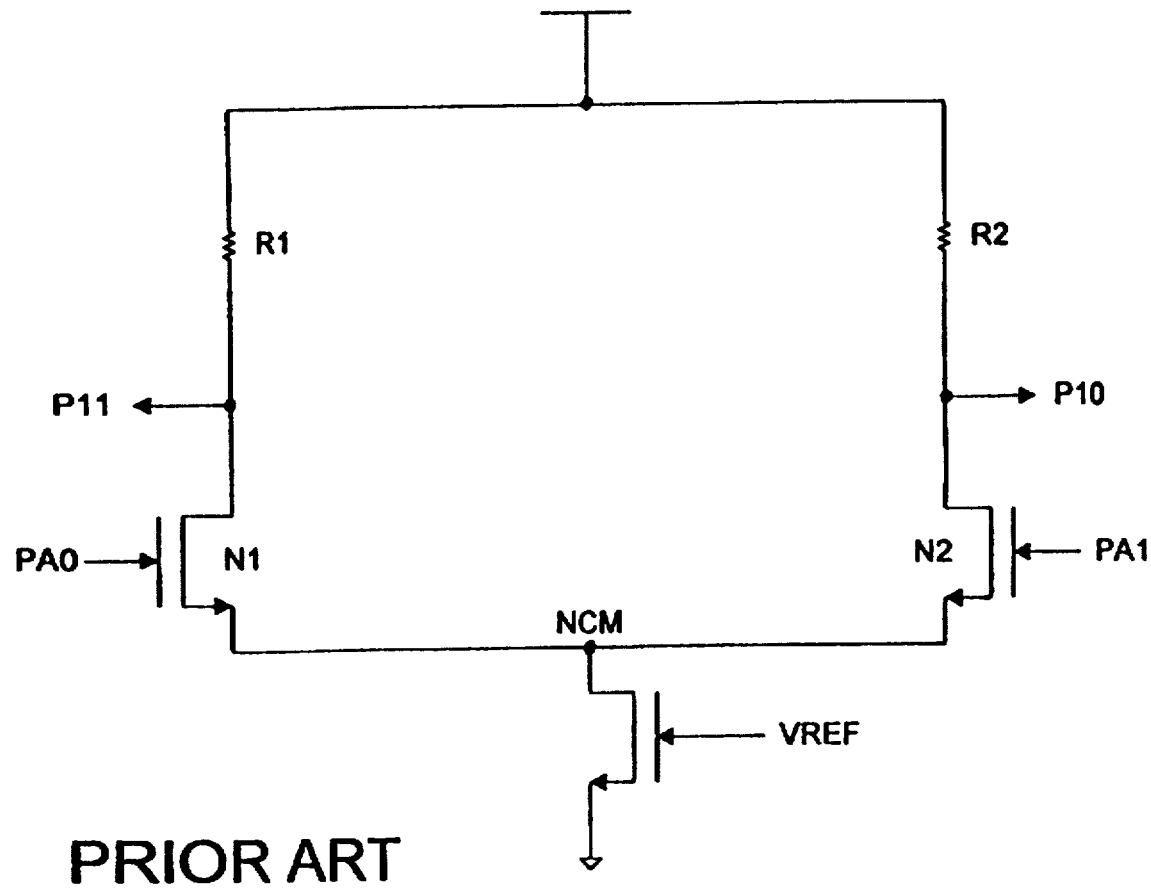
FIG. 2 is a schematic representation of a prior art differential delay cell of the single stage delay interpolating voltage controlled oscillator (VCO) of FIG. 1.

While the conventional delay cell of FIG. 2, the conventional differential analog multiplexer of FIG. 3 and the non-linear delay generating analog multiplexer 600 of FIG. 6 are illustrated with FET transistors, it should be understood that P3, P4, P6, P7, N4, and N5 could also be implemented using a current steering circuit with only N-channel FETs or with bipolar transistors. Many other types of ring VCOs exist with various methods of controlling the frequency. The key for any ring VCO in accordance with the preferred embodiment is to make the delay versus control voltage curve non-linear so that the frequency versus control voltage characteristic is linear.

While the present invention has been described with reference to the details of the embodiments of the invention shown in the drawing, these details are not intended to limit the scope of the invention as claimed in the appended claims.

What is claimed is:

1. A delay interpolating voltage controlled oscillator (VCO) comprising:

input means for receiving differential control input;

non-linear current steering means coupled to said input means for generating a non-linear delay responsive to said differential control input;

output means coupled to said non-linear current steering means for providing a frequency signal responsive to said input and said current steering means; said frequency signal being linearly related to said differential control input; and wherein said non-linear current steering means include two differential transistor pairs.

2. A delay interpolating voltage controlled oscillator (VCO) as recited in claim 1 wherein said non-linear current steering means include four field effect transistors (FETs) arranged as said two differential transistor pairs.

3. A delay interpolating voltage controlled oscillator (VCO) as recited in claim 1 wherein said two differential transistor pairs include two differential field effect transistors (FET) pairs, each said two differential FET pairs having unequal gate width to length ratios.

4. A delay interpolating voltage controlled oscillator (VCO) as recited in claim 3 wherein a gain of one of said two differential FET pairs is low and unbalanced.

5. A delay interpolating voltage controlled oscillator (VCO) as recited in claim 3 wherein a gain of one of said two differential FET pairs is high and unbalanced.

6. A delay interpolating voltage controlled oscillator (VCO) as recited in claim 1 includes a differential delay cell and an analog multiplexer; and said analog multiplexer includes said non-linear current steering means.

7. An inverter ring voltage controlled oscillator (VCO) comprising:

a ring of a plurality of differential inverter buffers; each of said plurality of differential inverter buffers including input means for receiving differential control input;

non-linear current steering means coupled to said input means for generating a non-linear delay responsive to said differential control input; and output means coupled to said non-linear current steering means for providing a frequency signal responsive to said input and said current steering means; said frequency signal being linearly related to said differential control input.

8. An inverter ring voltage controlled oscillator (VCO) as recited in claim 7 wherein said non-linear current steering means include two differential field effect transistors (FET) pairs, each said two differential FET pairs having unequal width to length gate ratios.

9. An inverter ring voltage controlled oscillator (VCO) as recited in claim 8 wherein a gain of one of said two differential FET pairs is low and unbalanced; and a gain of another of said two differential FET pairs is high and unbalanced.

* * * * *